United States Patent
Satoh et al.

(10) Patent No.: US 6,207,959 B1
(45) Date of Patent: Mar. 27, 2001

(54) ION IMPLANTER

(75) Inventors: Shu Satoh, Byfield; Theodore H. Smick, Essex, both of MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/294,995

(22) Filed: Apr. 20, 1999

Related U.S. Application Data

(63) Continuation-in-part of application No. 09/293,940, filed on Apr. 19, 1999, now abandoned.

(51) Int. Cl.[7] .................................................. H01J 37/00
(52) U.S. Cl. ................................. 250/442.11; 250/492.21
(58) Field of Search ........................ 250/442.11, 492.21

(56) References Cited

U.S. PATENT DOCUMENTS

| | | | |
|---|---|---|---|
| 4,745,287 | * 5/1988 | Turner | 250/442.11 |
| 4,929,840 | 5/1990 | Dykstra et al. | |
| 4,975,586 | 12/1990 | Ray . | |
| 5,003,183 | 3/1991 | Nogami et al. | |
| 5,229,615 | 7/1993 | Brune et al. | |
| 5,525,807 | * 6/1996 | Hirokawa et al. | 250/442.11 |
| 5,898,179 | * 4/1999 | Smick et al. | 250/442.11 |

FOREIGN PATENT DOCUMENTS

WO9913488    3/1999    (WO).

* cited by examiner

Primary Examiner—Kiet T. Nguyen
(74) Attorney, Agent, or Firm—Boult Wade Tennant

(57) ABSTRACT

An ion implanter for sequentially processing single semiconductor wafers includes a scanning arm extending along a first axis. A wafer holder is mounted on a free end of the arm so as to be rotatable about a second axis centered on and perpendicular to the plane of the wafer. The wafer can be scanned through an ion beam by reciprocating the arm transversely of the first axis. A rotary motor is mounted in the scanning arm near the free end with its axis of rotation parallel to the first axis and perpendicular to the second axis. A right angle rotary drive connects the motor to the wafer holder. A hard stop is provided on the motor to prevent the wafer from being rotated by more than 360°. Connections to the wafer on the holder are provided by a flexible circuit coiled about the second axis. The scanning mechanism can itself be rotated about an axis parallel to the arm so as to tilt the scanning direction, the wafer holder is itself further rotatable about the arm axis relative to the scanning mechanism. This enables the wafer to be rotated to the horizontal when the mechanical scanning mechanism holds the arm with the wafer above the beam.

14 Claims, 4 Drawing Sheets

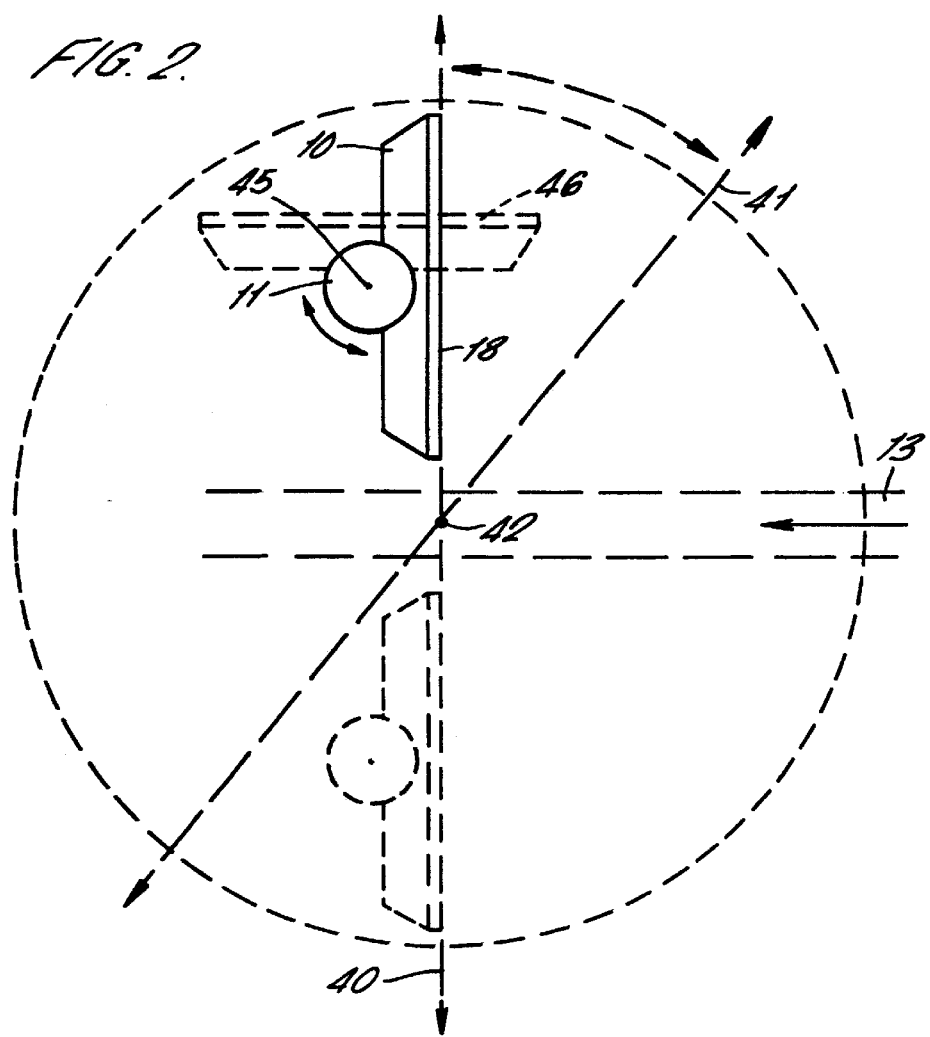
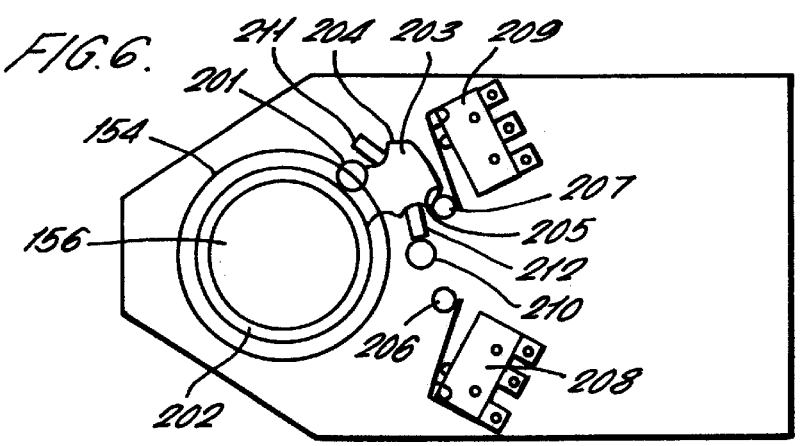

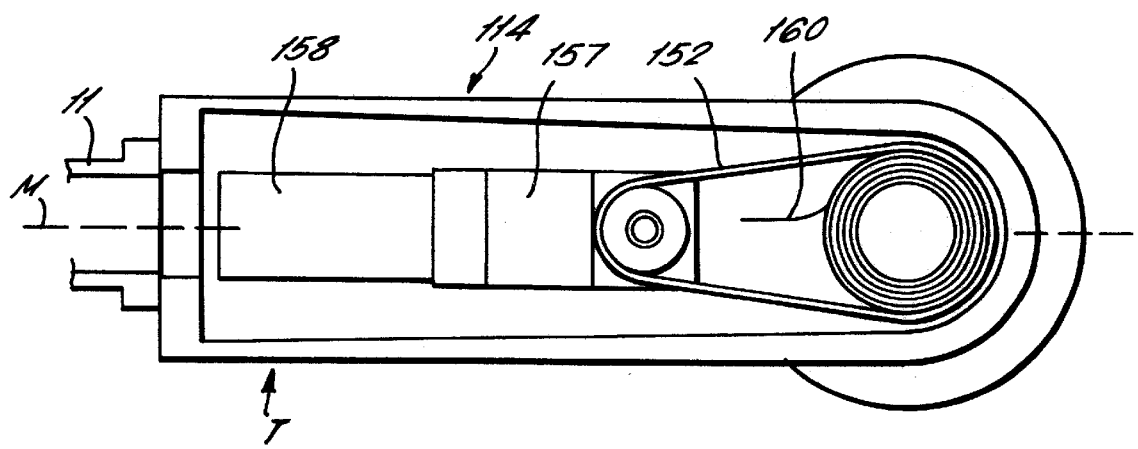
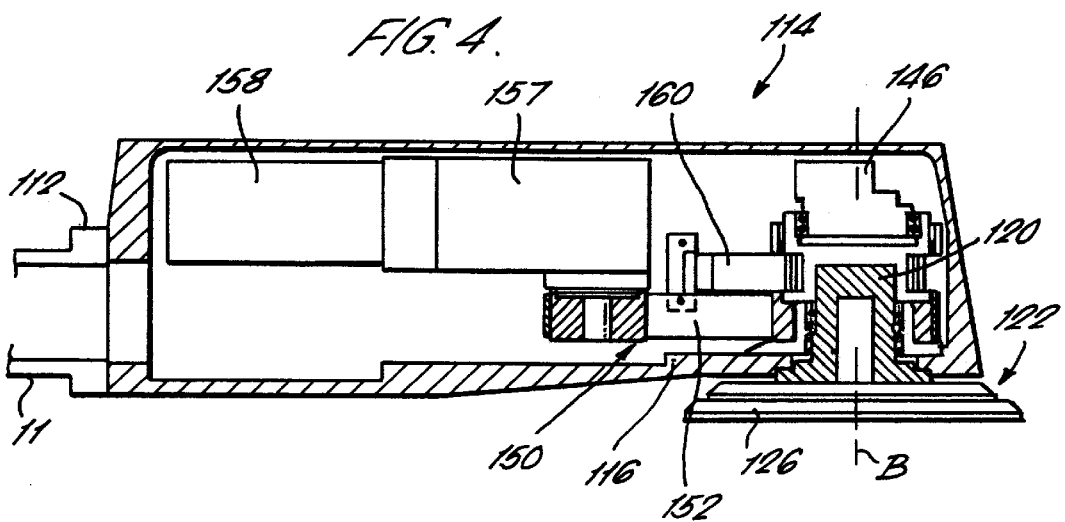

ION IMPLANTER

This application is a continuation-in-part of application Ser. No. 09/293,940, filed on Apr. 19, 1999, now abandoned, the entire contents of which are hereby incorporated by reference.

FIELD OF THE INVENTION

This invention is concerned with improvements in or relating to ion implanters.

BACKGROUND OF THE INVENTION

Ion implanters are commonly used in the manufacture of semiconductor and metallic products for implanting ions into semiconductor or metallic substrates to change the conductivity of the material in such substrates or in predefined regions thereof. Ion implanters generally comprise an ion beam generator for generating a beam of ions, and means for selecting a particular species of ions in the ion beam and for directing the ion beam through a vacuum chamber onto a target substrate supported on a substrate holder.

In typical prior art implanters, for sequentially processing single wafers, such as are disclosed in U.S. Pat. Nos. 4,929,840, 4,975,586 and 5,003,183, the substrate holder is mounted for rotation so as to rotate the holder in front of the ion beam, with the substrate holder being rotatable about a first axis extending substantially along a wafer diameter in the plane defined by the wafer surface, and about a second axis perpendicular to the first axis and extending through the centre of the wafer. The drive systems providing for rotation of the wafer support are described as being operable independently of one another and include stepper motors mounted outside the vacuum chamber.

The motor for rotating the wafer holder about the wafer axis is coupled to the wafer holder via two relatively lengthy drive shafts coupled by a belt transmission, the final of the two drive shafts being coupled to the wafer holder by a bevel gear arrangement.

In U.S. Pat. No. 5,229,615, there is disclosed a single wafer ion implanter in which a substrate holder, or platen assembly, is mounted for rotation about the wafer axis on an arm and is coupled to a motor by a chain drive system. The arm has a housing containing the motor and is arranged also to enclose the chain drive system. The resulting arm is bulky in cross-section and relatively heavy.

SUMMARY OF THE INVENTION

An objective of the present invention is to provide an implanter with a scanning arm assembly, enabling rotation of the wafer holder about the wafer axis, which is lighter and more reliable.

The invention provides an ion implanter for sequentially processing single semiconductor wafers, comprising a scanning arm extending along a first axis between an outer end and an inner end, a wafer holder mounted on the inner end of said arm to hold a wafer in a plane generally parallel to said first axis and arranged for rotation relative to the arm about a second axis centered on and perpendicular to the plane of a wafer on the wafer holder, a scanning mechanism connected to the outer end of said arm for repeatedly reciprocating the arm transversely of said first axis to scan a wafer on the wafer holder to and fro across an ion beam, a rotary motor mounted in the scanning arm inwardly of said outer end thereof, the rotary motor having its axis of rotation extending in the direction of said first axis and perpendicular to said second axis, and a right angle rotary drive mechanism connecting the motor to the wafer holder for controlling rotation of the wafer holder about said second axis.

By mounting the drive motor for the wafer holder in the scanning arm with the axis of the motor aligned with the scanning arm axis, the cross-sectional profile of the scanning arm can be substantially reduced. Importantly also, the right angle drive mechanism connecting the motor to the wafer holder is less bulky, extends over a shorter distance, and is more reliable.

Preferably the right angle rotary drive mechanism comprises a right angle direct drive gear driven by the motor and a belt drive interconnecting the right angle gear and the wafer holder.

The rotary drive mechanism may provide a reduction ratio of R:1 (where R is >1), between the motor and the wafer holder, and further include a hard stop limiting rotation of the motor to a range of substantially R turns, such as to limit rotation of the wafer holder to a maximum of just over 360°.

In some applications, the wafer holder may include electrical components, such as electrodes on the platen of the wafer holder for holding the wafer to the wafer holder by electrostatic force. A flexible conductor element may then be employed to provide electrical connections from the scanning arm to the electrical components of the wafer holder, said flexible conductor element being coiled about said second axis to accommodate rotation of the wafer holder by coiling and uncoiling.

The present invention also provides an ion implanter for sequentially processing single semiconductor wafers comprising a wafer holder mounted for rotation about an axis centred on and perpendicular to the plane of a wafer on the wafer holder, a rotary motor, and a drive mechanism connecting the motor to the wafer holder to control rotation thereof about said axis, said drive mechanism providing a reduction ratio R:1, where R is >1, between the motor and the wafer holder, and a hard stop limiting rotation of the motor to a range of substantially R turns such as to limit rotation of the wafer holder to a maximum of just over 360°.

The invention still further provides an ion implanter for sequentially processing single semiconductor wafers comprising a wafer holder including electrical components and mounted for rotation about an axis centred on and perpendicular to the plane of a wafer on the wafer holder, a motor, a drive mechanism connecting the motor to the wafer holder for controlling rotation thereof about said axis, and a flexible conductor element to provide electrical connections to the electrical components of the wafer holder, said flexible conductor element being coiled about said axis to accommodate rotation of said wafer holder by coiling and uncoiling.

The present invention still further provides an ion implanter for sequentially processing single semiconductor wafers, comprising a scanning arm extending along a generally horizontal axis between an outer end and an inner end, a wafer holder mounted on the inner end of said arm to hold a wafer in a plane generally parallel to said horizontal axis, a scanning mechanism connected to the outer end of said arm for applying a repeated reciprocating linear motion to the arm maintaining said axis generally horizontal, said linear motion being transverse to said axis to scan a wafer on the wafer holder to and fro through an ion beam, and a tilt adjusting mechanism for rotating the scanning mechanism about an axis parallel to said horizontal axis of the scanning arm for adjusting the angle to the vertical of said linear reciprocating motion applied by said scanning mechanism, wherein the outer end of said scanning arm is mounted for rotation of the arm about said horizontal axis of the arm relative to said scanning mechanism.

BRIEF DESCRIPTION OF THE DRAWINGS

FIG. 2 is a diagrammatic view illustrating various motions of the substrate holder during operation of the ion implanter;

FIG. 3 is a rear view, with parts removed for purposes of clarity, of the inner part of an arm assembly embodying the present invention;

FIG. 4 is a side view of the arm assembly shown in FIG. 3 and viewed in the direction of the arrow T therein;

FIG. 6 is a view of the end stop used to limit the range of rotation of the motor in the arm.

DETAILED DESCRIPTION OF THE PREFERRED EMBODIMENTS

Figure 1:
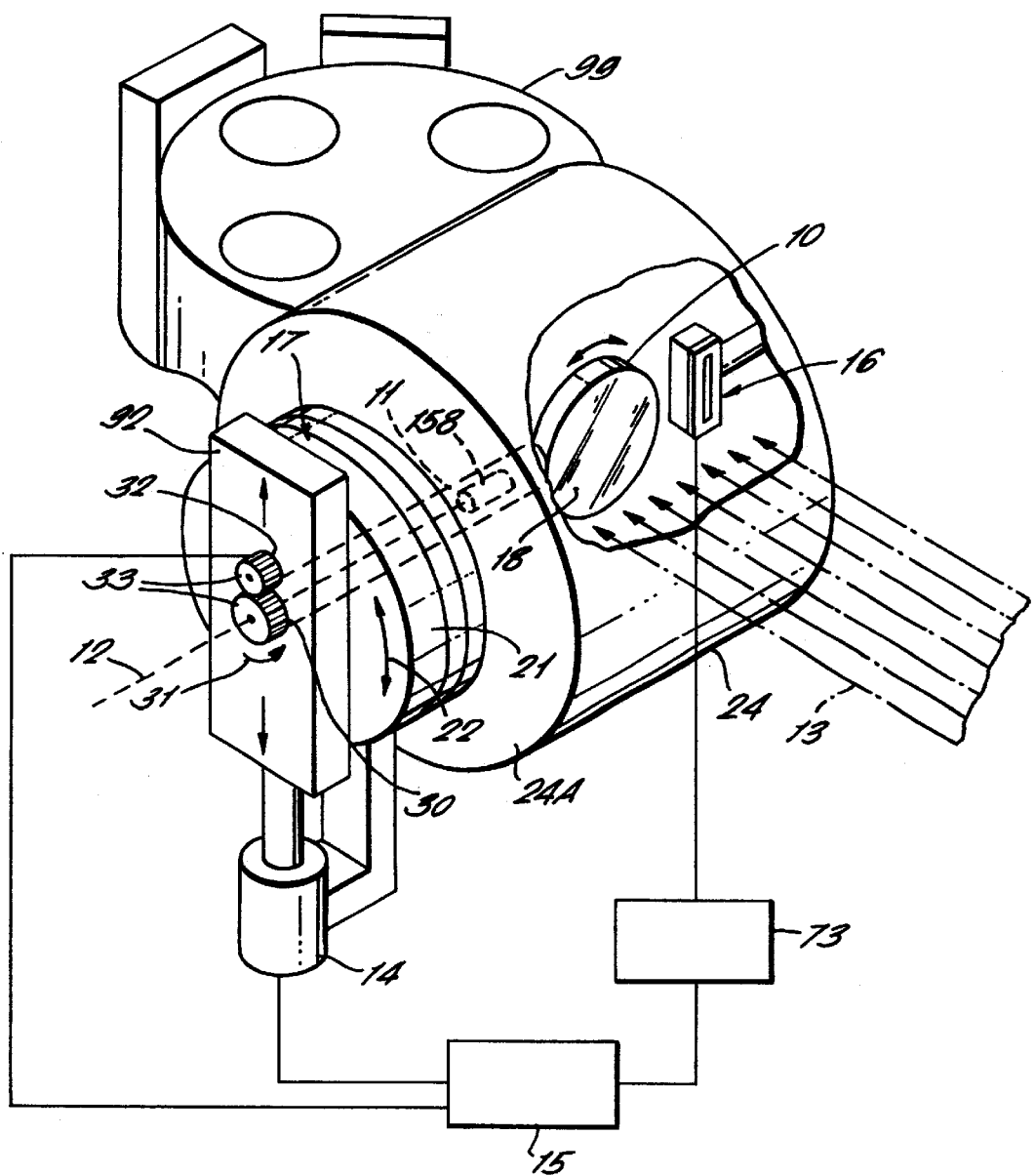
FIG. 1 is a perspective view of the processing chamber of an ion implanter embodying the present invention.

Referring firstly to FIG. 1, there is shown the process chamber of an ion implanter which can be used to scan mechanically 200 or 300 mm substrates in the form of silicon wafers through an ion beam, which is generally indicated at 13. The illustrated arrangement is similar to that described in International Patent Application No. WO 99/13488 the disclosure of which is incorporated herein by reference.

In the illustrated arrangement, the ion beam is fanned or scanned at relatively high speeds (e.g. in the range of about 150 Hz) in a first direction transverse to the beam direction. Mechanical scanning moves the wafer back and forth at relatively lower speeds (e.g. in the range of 0.5 to 1 Hz) through the scanned ion beam in a second direction orthogonal to said first direction.

Referring to FIG. 1, the ion implanter process chamber comprises a vacuum chamber 24 which is connected to other parts of the ion implanter to receive a scanned ion beam 13. The ion source, mass selection magnet and scanning arrangements of the ion implanter are not described further herein as they do not contribute to the concept of the present invention.

Inside the vacuum chamber 24, the wafer 18 is mounted on a wafer holder 10 which is supported at the inner end of a scanning arm 11. The scanning arm 11 is itself mounted at its outer end on a scanning mechanism indicated generally at 17. The scanning mechanism comprises a linear reciprocating part 92 on which is mounted the outer end of the scanning arm 11 carrying the wafer holder 10. The reciprocating part 92 is itself mounted on a rotary part 21 which is mounted for rotation in the direction of arrow 22 on an end wall 24A of the vacuum chamber 24.

Reciprocating movement of the part 92 of the scanning mechanism is effective by an actuator 14. The rotatable part 21 of the scanning mechanism 17 is in the present embodiment, mounted by means of a low friction air bearing and vacuum seal arrangement as described in the above referred International specification. Similarly, the sliding part 92 of the scanning mechanism is also mounted to the rotary part 22 by means of a friction free air bearing and vacuum seal arrangement, again as disclosed in the International specification.

In the embodiment disclosed in FIG. 1, the scanning arm 11 is mounted in the sliding part 92 so that the scanning arm 11 can itself rotate about its axis 12. Thus, the scanning arm is mounted in a rotary seal 30 in the sliding part 92 so that the arm can rotate relative the sliding part as indicated by the arrow 31. The rotational position about the axis 12 of the scanning arm 11 can be controlled by means of a motor 32 mounted on the sliding part 92 and driving the scanning arm 11 for rotation about the axis 12, by means of gears 33.

FIG. 2 illustrates the various freedoms of movement of the wafer holder 10 on the scanning arm 11, provided by the rotary member 21 and the sliding part 92 of the scanning mechanism 17. In FIG. 2 the scanned ion beam is illustrated at 13. The view of FIG. 2 is taken in the plane of the scanned beam. Operation of the actuator 14, reciprocates the scanning arm 11 and the wafer holder 10 to and fro in the direction of arrow 40. The extent of the reciprocal motion in the direction of arrow 40 is sufficient so that the wafer 18 on the wafer holder 10 completely clears the ion beam 13 at each end of the reciprocating stroke of the scanning mechanism. The position of the arm and wafer is illustrated in dotted outline at the other end of the reciprocating scan beneath the beam 13.

The angle relative to the vertical at which the scanning motion takes place can be adjusted by rotating the rotary part 21 of the scanning mechanism 17. The centre of rotation of the rotary part 21 is arranged to be substantially in the plane of a wafer mounted on the wafer holder 10, when the wafer holder and scanning arm 11 is orientated to be parallel to this reciprocating scan direction.

As a result, the reciprocating scan direction can be altered, for example to the orientation of arrow 41, whereupon the wafer is then still scanned in its own plane along the line of the arrow 41. Moreover the arrow 41 passes through the same point 42, which is the axis of rotation of the rotary part 21 of the scanning mechanism.

In this way, the angle of tilt of the wafer relative to the ion beam during scanning can be adjusted as required.

In the present embodiment, the scanning arm 11 is itself mounted for rotation about its own axis 45. If the scanning arm and wafer holder 10 is held fixed in the orientation illustrated in FIG. 2 with the wafer 18 in the plane of the scanning direction of the reciprocating part 92, rotation of the rotary part 21 of the scanning mechanism through 90° anticlockwise from the vertical orientation illustrated in FIG. 2, will bring the wafer holder 10 to a horizontal orientation carrying the wafer 18 on top. A processed wafer could be removed from the holder in this orientation and a fresh wafer supplied to the holder. However, in this orientation, the wafer holder is invariably located in the position of the scanned ion beam 13. Therefore, the beam must be interrupted upstream of the processing position, if wafer unloading and loading is to be performed in this way using only the rotation of the mechanical scanning mechanism 17 to bring the wafer holder to the horizontal orientation.

By additionally arranging for the scanning arm 11 to be itself rotatable about its axis 45, the wafer holder can be rotated, by operation of the drive motor 32 rotating the scanning arm 11, to the horizontal position as illustrated in dotted outline at 46 in FIG. 2, when the linear scanning mechanism has the scanning arm 11 at the upper end of a linear scan, the scanning direction being generally vertical. In this way, the wafer holder 10, can be brought to the horizontal position when the wafer holder is well clear above the line of the scanned ion beam 13. As a result, it becomes possible to load and unload wafers from the wafer holder 10 without interrupting the ion beam 13.

As illustrated in FIG. 1, the ion implanter includes a controller 15 connected to control the operation of the reciprocating actuator 14 as well as the motor 32 controlling the orientation of the scanning arm 11. The controller 15 may also be arranged to effect control of the rotary position of the rotary part 21 of the scanning mechanism 17. The controller 15 is illustrated in FIG. 1 receiving signals from a slot Faraday 16 via an integrator 73. The slot Faraday 16 with the integrator 73 allows a signal to be generated representative of the current in the ion beam which may be used as a control input to the controller 15 for dose monitoring purposes.

FIG. 1 also illustrates schematicly a wafer handling arrangement 99 providing a source of fresh wafers for processing in the chamber 24. Typically a vacuum robot is provided inside the chamber 24 for removing processed wafers from the wafer holder 10 when the wafer holder is in the horizontal orientation as described above with reference to FIG. 2, and for delivering fresh wafers to the wafer holder for subsequent processing.

In order to automate the procedure, the controller 15, which may incorporate one or more microprocessors, is arranged so that at the end of an implant process, the rotary part 21 of the scanning mechanism 17 brings the reciprocating direction of the sliding part 92 to the vertical, brings the sliding part 92 to the uppermost position with the wafer holder 10 above the beam 13, and then rotates the scanning arm 11 about its axis to bring the wafer holder 10 to the horizontal position as illustrated at 46 in FIG. 2.

The vacuum robot within the vacuum chamber 24 can then be controlled to remove the processed wafer from the holder 10 and deliver a fresh wafer to the holder for subsequent processing.

Figure 5:
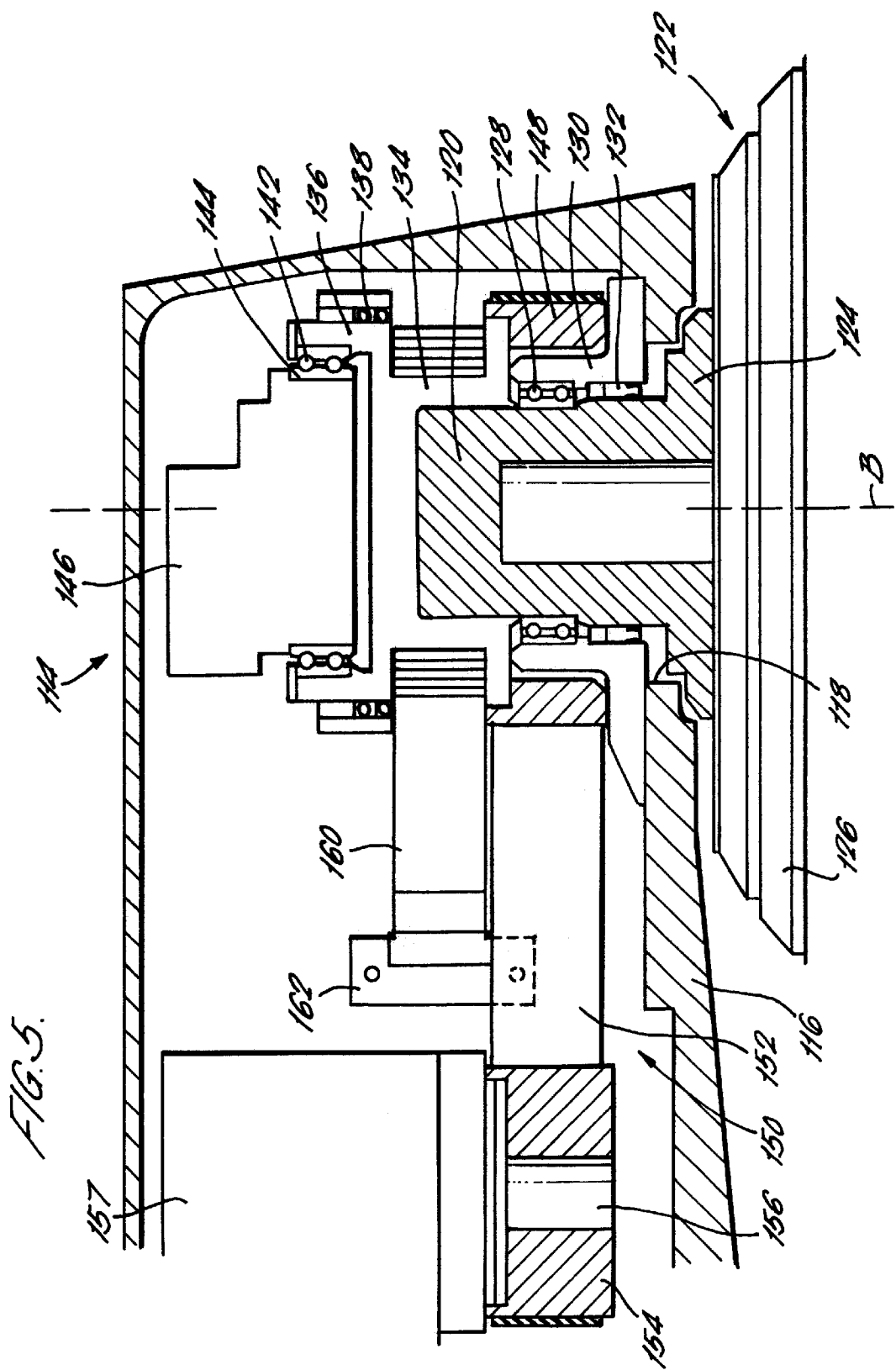
FIG. 5 is an enlargement of a part of FIG. 4.

In the scanning arm assembly illustrated in FIG. 1, the wafer holder 10 is mounted on the arm 11 so as to be rotatable about an axis normal to the surface of and centred on the substrate itself. The arm 11 is hollow and extends through the rotary vacuum seal 30 in the sliding part 92 of the scanning mechanism 17, so that the interior of the arm is at atmospheric pressure. Referring to FIGS. 3, 4 and 5 the arm 11 is of generally cylindrical section and has an annular collar portion 112, sealed to an elongate housing generally indicated at 114.

Adjacent an inner end of the housing 114 remote from its coupling to the arm 11, the housing 114 has a wall portion 116 in which is formed a stepped circular aperture 118 through which a hub 120 of the substrate holder, generally indicated at 122, is mounted for rotation about an axis B. The hub 120 is cylindrical and has a stepped annular flanged end portion 124 which seats in spaced relationship from the stepped surface of the aperture 118.

The substrate holder 10 comprises a circular metal platen 126 which is mounted concentrically with the hub 120 for rotation about the axis B. The platen 126 is of a diameter such as to receive a substrate, e.g. in the form of a disc-shaped semiconductor wafer.

The hub 120 is mounted for rotation in a bearing assembly 128 in a bearing support provided by an annular sleeve 130 which is of generally L-section and is secured to the inside face of the wall portion 116 of the housing 114, concentrically with the circular aperture 118.

The surface of the hub 120 is sealed against the inner surface of the sleeve 130 by a rotary vacuum seal 132 which may be of standard type.

Mounted on the hub is a spool 134 and an annular skirt 148 which is coaxial with the axis B and which provides a driven wheel of a drive belt arrangement generally indicated at 150. The drive belt assembly comprises the driven wheel 148, a belt 152 held in tension and a drive wheel 154.

As can be seen from the Figures, and from FIG. 4 and 5 in particular, the substrate holder is securely mounted for rotation in the arm. Rotation of the substrate holder is achieved by means of the drive belt arrangement 150, the drive wheel 154 of which is itself mounted on a shaft 156. An electric motor 158 is mounted in the housing with its axis of rotation aligned parallel to the axis M of the scanning arm 11 and perpendicular to the axis B of the wafer holder. The motor 158 drives the shaft 156 via a right angle drive assembly 157.

The body of the spool 134 provides a cylindrical former around which is loosely coiled a flat helically wound flexible conductor 160 which provides electrical connections to electrical components on the wafer holder 126, such as electrodes for electrostatically clamping wafers to the platen of the holder. The conductor is secured at an inner end to the spool and is sufficiently loosely wound that it can accommodate a 360° rotation of the substrate holder without becoming tightly wound. The opposite end of the conductor 160 is connected to a connector 162 whereby it can be electrically connected to power supplies and signal lines as required.

The flexible conductor 160 may be a flexible printed circuit carrying multiple conducting tracks and formed as a tape coiled around the spool 134.

When operating the ion implanter, the wafer holder 122 may be rotated to different orientations during a single implant process. For example, the implanter may be used for performing angled implants, typically for implanting into the side walls of trenches or other etched structures on the wafer surface. In order to ensure that walls at all orientations on the wafer surface are implanted, a wafer holder may be twisted in steps, typically of 90°, about its own axis during the implant process. It will be appreciated that the total range of orientations required can be provided by a single turn of the wafer holder through 360°.

Providing the coiled flexible conductor enables electrical connections to be provided to the rotary wafer holder in a reliable and simple fashion.

In order to ensure that the wafer holder is not rotated by the motor 158 through significantly more than 360° in total, a hard stop arrangement is provided to limit rotation of the motor 158 as illustrated in FIG. 6.

The right angle drive arrangement 157 provides a sixteen-to-one transmission ratio between the motor and the shaft 156. The hard stop mechanism illustrated in FIG. 6 is in fact associated with the shaft 156. In FIG. 6, the drive wheel or pulley 154 on the shaft 156 carries an axially extending pin 201. When the shaft 156 is rotated by the motor 158, the pulley 154 carries the pin 201 in a circular path around the axis of the shaft 156.

A ring element 202 is mounted for free rotation around the shaft 156 and carries intermediate stop member 203. The stop member 203 has cam surfaces 204 and 205 at a radially outer end of the stop member 203, and these cam surfaces engage the operating levers 206 and 207 of respective micro switches 208 and 209. The micro switches 208 and 209 provide emergency cut out of the energising supplies to the motor 158.

It should be understood that normally the motor 158 is controlled by an external controller, such as controller 15 illustrated in FIG. 1, to provide a predetermined amount of rotation of the wafer holder as required. Proper control of the motor 158 will normally ensure the motor operates only between limits of rotation which correspond to the required maximum 360° rotation range of the wafer holder. However, in the event of a control failure, it is important to ensure that the motor 158 does not attempt to drive the wafer holder beyond the predetermined 360° range of rotation, which would then cause damage to the flexible conductor element 160. Accordingly, the micro switches 208 and 209 are provided to cut off the power supply to the motor 158 if the motor is driven by the external controller beyond the required range.

The gearing between the pulley 154 and the wafer holder provides a further reduction of about 1.67:1, provided essentially by the difference in size between the drive wheel 154 and the driven wheel 148 carrying the belt 152.

Accordingly, the hard stop arrangement of FIG. 6, is designed to enable rather less than two rotations of the shaft 156. In FIG. 6, the shaft is shown at the extreme of clockwise rotation, in which the pin 201 which rotates with the shaft 156 is pressing the intermediate stop member 203 which is freely rotatable on the ring 202, against the operating lever 207 of the micro switch 209. Anticlockwise rotation of the shaft 156 causes corresponding anticlockwise movement of the pin 201. After about one full orbit of the pin 201 around the axis of the shaft 156, the pin engages on the opposite side of the intermediate stop member 203, whereupon, the ring 202 then rotates anticlockwise with the shaft 156 for nearly one further complete turn until the cam surface 204 of the stop member 203 engages the operating lever 206 of the micro switch 208.

It should be understood that under normal control, the motor is stopped by the external controller before operation of the micro switches 208 and 209.

In order to ensure a hard stop beyond which the shaft 156 cannot rotate further, e.g. due to angular momentum following operation of the associated micro switch, a further hard stop pin 210 is mounted in a fixed position relative to the housing of the shaft 156. Then, the intermediate stop member 203 can mechanically engage the hard stop pin 210 to prevent further movement. Springs 211 and 210 are provided on the intermediate stop member 203 to ensure the intermediate stop member 203 is shifted back to release the associated micro switch, when the shaft 156 rotates back again.

Although embodiments of the invention have been described above in relation to a linearly scanned arm of the kind disclosed in International Patent Application No. WO 99/13488, it may be understood that other embodiments are also possible. All aspects of the invention are equally applicable to linearly scanned arms with different scanning mechanisms, such as those illustrated in U.S. Pat. No. 5,229,615. In such an embodiment, it would be necessary to mount a motor for rotating the scanning arm about its own axis on the wafer holder side of the linear scanning mechanism which, though possible, would be less advantageous than the arrangement possible with the linear scanning arrangement of the above International patent application. By comparison, in the arrangement of the above International Patent publication, the entire scanning arm can be made rotatable about its own axis relative to the linear sliding part 92 of the scanning mechanism 17, and the motor to drive this rotation of the arm can be mounted externally of the vacuum chamber. This greatly simplifies the construction and improves maintainability. Also rigidity of the scanning arm is improved.

It is also feasible to employ the arrangements disclosed herein for driving the rotation of the wafer holder about the axis of the wafer, in scanning arrangements in which the scanning arm is reciprocated by rotating the arm about a rotary joint at an outer end of the arm, so that the wafer holder describes an arc to and fro through the ion beam, similar to the arrangement disclosed in U.S. Pat. No. 5,003,183.

Generally other variants and embodiments of the invention may be contemplated without departing from the invention as defined in the accompanying claims.

What is claimed is:

1. An ion implanter for sequentially processing single semiconductor wafers comprising:

a scanning arm extending along a first axis between an outer end and an inner end, a wafer holder mounted on the inner end of said arm to hold a wafer in a plane generally parallel to said first axis and arranged for rotation relative to the arm about a second axis centred on and perpendicular to the plane of a wafer on the wafer holder, a scanning mechanism connected to the outer end of said arm for repeatedly reciprocating the arm transversely of said first axis to scan a wafer on the wafer holder to and fro through an ion beam, a rotary motor mounted in the scanning arm inwardly of said outer end thereof, the rotary motor having its axis of rotation extending in the direction of said first axis and perpendicular to said second axis, and a right angle rotary drive mechanism connecting the motor to the wafer holder for controlling rotation of the wafer holder about said second axis.

2. An ion implanter as claimed in claim 1, wherein said right angle rotary drive mechanism comprises a right angle direct drive gear driven by the motor and a belt drive interconnecting the right angle gear and the wafer holder.

3. An ion implanter as claimed in claim 1, wherein said right angle rotary drive mechanism provides a reduction ration of R:1, where R>1, between the motor and the wafer holder, and further includes a hard stop limiting rotation of the motor to a range of substantially R turns, such as to limit rotation of the wafer holder to a maximum of just over 360°.

4. An ion implanter as claimed in claim 3, wherein the hard stop comprises:

a shaft driven by the motor, a moving stop member mounted on said shaft at a predetermined radial distance from the axis of the shaft, at least one freely rotatable ring coaxial with said shaft, an intermediate stop member mounted on said ring at a radial position to be engaged on opposite sides by said moving stop member following rotation of said shaft by a maximum of up to one turn, and a fixed stop member located to be engaged on opposite sides by said intermediate stop member following rotation of said ring by a maximum of up to one turn, whereby engagement of said intermediate stop member by said moving stop member, and then engagement of said fixed stop member by said intermediate stop member, limits rotation of said shaft to a maximum of up to two turns.

5. An ion implanter as claimed in claim 1, wherein the wafer holder includes electrical components and the implanter has a flexible conductor element to provide electrical connections from the scanning arm to the electrical components of the wafer holder, said flexible conductor element being coiled about said second axis to accommodate rotation of the wafer holder by coiling and uncoiling.

6. An ion implanter for sequentially processing single semiconductor wafers comprising a wafer holder mounted for rotation about an axis centred on and perpendicular to the plane of a wafer on the wafer holder, a rotary motor, and a drive mechanism connecting the motor to the wafer holder to control rotation thereof about said axis, said drive mechanism providing a reduction ratio R:1, where R>1, between the motor and the wafer holder, and a hard stop limiting rotation of the motor to a range of substantially R turns, such as to limit rotation of the wafer holder to a maximum of just over 360°.

7. An ion implanter as claimed in claim 6, wherein the wafer holder includes electrical components and the implanter has a flexible conductor element to provide electrical connections to the electrical components of the wafer holder, said flexible conductor element being coiled about said axis to accommodate rotation of the wafer holder by coiling and uncoiling.

8. An ion implanter as claimed in claim 6, wherein the hard stop comprises:

a shaft driven by the motor, a moving stop member mounted on said shaft at a predetermined radial distance from the axis of the shaft, at least one freely rotatable ring coaxial with said shaft, an intermediate stop member mounted on said ring at a radial position to be engaged on opposite sides by said moving stop member following rotation of said shaft by a maximum of up to one turn, and a fixed stop member located to be engaged on opposite sides by said intermediate stop member following rotation of said ring by a maximum of up to one turn, whereby engagement of said intermediate stop member by said moving stop member, and then engagement of said fixed stop member by said intermediate stop member, limits rotation of said shaft to a maximum of up to two turns.

9. An ion implanter for sequentially processing single semiconductor wafers comprising a wafer holder including electrical components and mounted for rotation about an axis centred on and perpendicular to the plane of a wafer on the wafer holder, a motor, a drive mechanism connecting the motor to the wafer holder for controlling rotation thereof about said axis, and a flexible conductor element to provide electrical connections to the electrical components of the wafer holder, said flexible conductor element being coiled about said axis to accommodate rotation of said wafer holder by coiling and uncoiling.

10. An ion implanter for sequentially processing single semiconductor wafers, comprising a scanning arm extending along a generally horizontal axis between an outer end and an inner end, a wafer holder mounted on the inner end of said arm to hold a wafer in a plane generally parallel to said horizontal axis, a scanning mechanism connected to the outer end of said arm for applying a repeated reciprocating linear motion to the arm maintaining said axis generally horizontal, said linear motion being transverse to said axis in a plane containing said axis, said plane being at a selected angle to vertical, so as to scan a wafer on the wafer holder to and from through an ion beam, and a tilt adjusting mechanism for rotating the scanning mechanism about an axis parallel to said horizontal axis of the scanning arm for adjusting said angle to vertical of said plane of linear reciprocating motion applied by said scanning mechanism within a range of angles, said wafer holder being further mounted for rotation about said horizontal axis of the arm relative to said scanning mechanism.

11. An ion implanter as claimed in claim 10, wherein the outer end of the scanning arm is mounted for rotation of the arm about said horizontal axis of the arm relative to said scanning mechanism.

12. An ion implanter as claimed in claim 11 and including a motor connected to said scanning arm for controlling the rotational position of said arm about said horizontal axis relative to the scanning mechanism.

13. An ion implanter as claimed in claim 12 including a wafer handling mechanism for unloading processed wafers from the wafer holder and loading fresh wafers onto the wafer holder, and a controller for controlling movements of the wafer holder to a position for unloading and loading by said wafer handling mechanism by setting the tilt adjusting mechanism to make said plane of said linear reciprocating motion substantially vertical, controlling the scanning mechanism to bring the scanning arm to an upper extreme of said linear motion with the wafer holder above the ion beam, and controlling said motor to rotate the scanning arm about said horizontal axis of the arm to bring a wafer on the wafer holder to a substantially horizontal plane resting on top of the wafer holder.

14. An ion implanter as claimed in claim 10, wherein said range of angles includes zero.

* * * * *